(12) United States Patent
Wang et al.

(10) Patent No.: US 12,381,103 B2
(45) Date of Patent: Aug. 5, 2025

(54) MULTIPLE SUBSTRATE HANDLING SYSTEM AND METHOD

(71) Applicant: Applied Materials, Inc., Santa Clara, CA (US)

(72) Inventors: Hsiu-jen Wang, Taichung (TW); Sin-Yi Jiang, Hsinchu (TW); Neng-rui Dong, Taoyuan (TW); Shih-Hao Kuo, Hsinchu (TW); Chia-Hung Kao, Keelung (TW); Bang-Yu Liu, Taichung (TW); Hsu-Ming Hsu, Tainan (TW)

(73) Assignee: Applied Materials, Inc., Santa Clara, CA (US)

( * ) Notice: Subject to any disclaimer, the term of this patent is extended or adjusted under 35 U.S.C. 154(b) by 291 days.

(21) Appl. No.: 18/015,130

(22) PCT Filed: Jun. 16, 2021

(86) PCT No.: PCT/US2021/037652
§ 371 (c)(1),
(2) Date: Jan. 9, 2023

(87) PCT Pub. No.: WO2022/026071
PCT Pub. Date: Feb. 3, 2022

(65) Prior Publication Data
US 2023/0260815 A1    Aug. 17, 2023

Related U.S. Application Data

(60) Provisional application No. 63/059,782, filed on Jul. 31, 2020.

(51) Int. Cl.
*H01L 21/677* (2006.01)
*G03F 7/00* (2006.01)
*H01L 21/68* (2006.01)

(52) U.S. Cl.
CPC ...... *H01L 21/67766* (2013.01); *G03F 7/7075* (2013.01); *H01L 21/67742* (2013.01);
(Continued)

(58) Field of Classification Search
CPC ......... H01L 21/67754; H01L 21/67745; H01L 21/67781; H01L 21/67742; H01L 21/67766; H01L 21/6733
See application file for complete search history.

(56) References Cited

U.S. PATENT DOCUMENTS 6,835,039 B2 * 12/2004 van den Berg ... H01L 21/67379
414/217
7,762,208 B2 * 7/2010 Juergensen ....... H01L 21/68771
156/345.31
(Continued)

FOREIGN PATENT DOCUMENTS

EP    761318 A2 *  3/1997 ............. B05C 11/08
JP    5369233 B2    12/2013
(Continued)

OTHER PUBLICATIONS

International Search Report and Written Opinion dated Oct. 8, 2021 for Application No. PCT/US2021/037652.
(Continued)

*Primary Examiner* — Kaitlin S Joerger
(74) *Attorney, Agent, or Firm* — Patterson + Sheridan, LLP

(57) ABSTRACT

The present disclosure provides a multi-substrate handling system having an alignment apparatus capable of positioning each of a set of substrates in predetermined orientations for transfer. A buffer chamber is configured to receive and condition the set of substrates which are disposed on a substrate carrier. A first transfer assembly is configured to transfer the set of substrates to and from the buffer chamber
(Continued)

and is capable of transferring each of the set of substrates from the alignment apparatus to the carrier in the buffer chamber. The carrier includes a plurality of modules capable of securing the set of substrates. The system includes a second transfer assembly having at least two robots configured to transfer the carrier of the set of substrates between the buffer chamber and a process chamber. The process chamber is capable of processing the set of substrates using different process parameters for each substrate.

20 Claims, 3 Drawing Sheets

(52) U.S. Cl.
CPC .. *H01L 21/67745* (2013.01); *H01L 21/67781* (2013.01); *H01L 21/681* (2013.01)

(56) References Cited

U.S. PATENT DOCUMENTS

| 8,911,554 | B2 | 12/2014 | Verhaverbeke et al. |
| 2006/0092399 | A1* | 5/2006 | Ockwell ............. G03F 7/70733 355/72 |
| 2009/0194026 | A1* | 8/2009 | Burrows ........... H01L 21/67115 118/729 |
| 2010/0111650 | A1 | 5/2010 | Quach et al. |
| 2015/0348773 | A1 | 12/2015 | Zhu et al. |
| 2019/0326146 | A1 | 10/2019 | Thirunavukarasu et al. |

FOREIGN PATENT DOCUMENTS

| KR | 10-0972346 | 7/2010 |
| KR | 20190101508 A | 8/2019 |
| KR | 102285969 B1 | 8/2021 |

OTHER PUBLICATIONS

Taiwan Office Action dated Jul. 31, 2024 for Application No. 110126187.

* cited by examiner

MULTIPLE SUBSTRATE HANDLING SYSTEM AND METHOD

BACKGROUND

Field

Embodiments of the present disclosure generally relate to systems and methods of manufacturing a semiconductor device. More particularly, the present disclosure is directed to apparatuses and methods for simultaneous processing of multiple substrates.

Description of the Related Art

Electronic devices are commonly formed in controlled processing environments using transfer systems to transfer substrates between environments. The effectiveness of device fabrication is often measured by device yield and cost of ownership (CoO). Device yield and CoO affect the cost to produce an electronic device and thus a device manufacturer's competitiveness in the market place. Device yield and CoO is affected by the system and process throughput which is defined by the number of substrates processed per hour using a process sequence. The sequence includes processing substrates at various chambers, and transferring substrates between the chambers. Operating parameters and/or conditions at each chamber and methods of transferring substrates are optimized for increased substrate throughput, however, certain limitations in processing often limit throughput. In particular, for lithography systems, chamber processing times can be optimized for individual substrates, however, processing substrates individually at each chamber and then transferring the substrates from chamber to chamber can limit throughput, especially in processes that involve different types of substrates using different process parameters (e.g., recipes).

Therefore, there is a need for a system and method for processing multiple substrates that can meet predetermined device performance and increase total throughput and reduce costs (e.g., CoO).

SUMMARY

In an embodiment, a multi-substrate handling system is provided having an alignment apparatus capable of positioning each of a set of substrates in predetermined orientations for transfer. A buffer chamber is configured to receive and condition the set of substrates which are disposed on a substrate carrier. A first transfer assembly is configured to transfer the set of substrates to and from the buffer chamber and is capable of transferring each of the set of substrates from the alignment apparatus to the carrier in the buffer chamber. The carrier includes a plurality of modules capable of securing the set of substrates. The system includes a second transfer assembly having at least two robots configured to transfer the carrier of the set of substrates between the buffer chamber and a process chamber. The process chamber is capable of processing the set of substrates using different process parameters for each substrate.

In another embodiment, a method is provided and includes transferring a first set of substrates from two or more pod assemblies to a first carrier in a buffer chamber. The first set of substrates includes at least two substrates with different substrate characteristics relative to one another. The method includes conditioning the first set of substrates disposed on the first carrier in the buffer chamber and transferring the first carrier having first set of substrates to a process chamber. The first set of substrates disposed on the first carrier is processed in the process chamber. The processing the first set of substrates uses different process parameters for each substrate.

In another embodiment, a substrate handling system is provided including a first transfer assembly configured to transfer a set of substrates to and from a buffer chamber. The buffer chamber is configured to condition the set of substrates. The buffer chamber includes a carrier that secures the set of substrates for processing. A second transfer assembly is provided and is configured to transfer the carrier of the set of substrates between the buffer chamber and a lithography apparatus. The lithography apparatus is capable of processing each substrate of the set of substrates simultaneously with one another.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Before describing embodiments of the present disclosure, it is to be understood that the present disclosure is not limited to the details of construction or methods set forth in the following description. The present disclosure is capable of other embodiments and of being practiced or being carried in various ways.

Certain aspects of the present disclosure provide for a multi-substrate handling system having an alignment apparatus capable of positioning each of a set of substrates in predetermined orientations for transfer. A buffer chamber is configured to receive and condition the set of substrates which are disposed on a substrate carrier. A first transfer assembly is configured to transfer the set of substrates to and from the buffer chamber and is capable of transferring each of the set of substrates from the alignment apparatus to the carrier in the buffer chamber. The carrier includes a plurality of modules capable of securing the set of substrates. The system includes a second transfer assembly having at least two robots configured to transfer the carrier of the set of substrates between the buffer chamber and a process chamber. The process chamber is capable of processing the set of substrates using different process parameters for each substrate.

Figure 1:
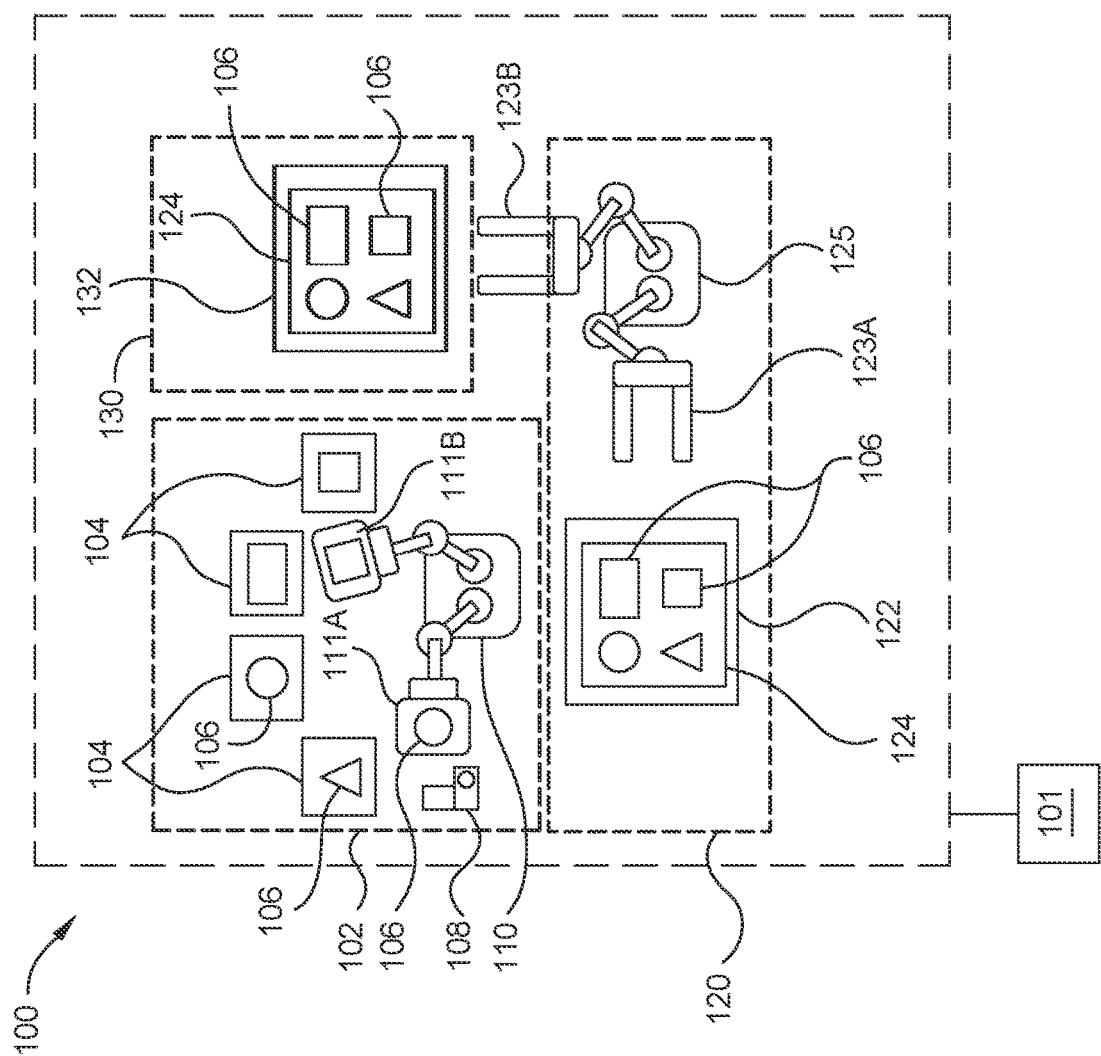
FIG. 1 depicts a multi-substrate handling system in accordance with an embodiment of the present disclosure.

FIG. 1 depicts a multi-substrate handling system in accordance with an embodiment of the present disclosure. The system includes an interface module 102, a buffer module 120, and a process module 130. The interface module 102 includes pod assemblies 104, an alignment apparatus 108, and a first transfer system 110 configured to transfer substrates from between one or more of the pod assemblies 104 and the alignment apparatus 108. The first transfer system 110 is also capable of transferring substrates from the interface module 102 to the buffer module 120 using one or more robots, such as robotic arms 111A, 111B. Each of the pod assemblies 104 are configured to maintain unprocessed and processed substrates. The pod assemblies 104 are front-end opening unified pods (FOUPs), and are generally adapted to accept one or more cassettes that contain one or more substrates that are to be conditioned and processed. Each FOUP is capable of holding up to 24 substrates at a time that are input to the system described herein. It is to be understood that 24 substrates is merely an example and not intended to be limiting. In conventional processes, a single type of substrate is disposed in an interface area and are processed sequentially, one at a time using the same process parameters at a processing chamber. Conventional substrate handing processes have a transfer system, the transfer system transfers one substrate at a time from a FOUP, aligns the substrate, and positions the substrate directly to a process chamber where one substrate is conditioned and processed at a time. After processing, the processed substrate is returned to the FOUP using the same transfer system. Moreover, the same transfer system then retrieves a next substrate for processing. The process has low throughput since the process relies on completing one substrate at a time and returning the substrate before the next substrate is processed. The system presently described herein is able to operate several operations and transfers simultaneously, as well as process several different types of substrates simultaneously so that throughput is optimized. The substrates can be any shape, such as rectangular, square, triangular, circular, or combinations thereof. Moreover, the substrates are silicon substrates, glass panels, solar substrates, staked structures, and combinations thereof. The thickness of the substrates are about 0.3 mm to about 5 mm, such as about 0.5 mm to about 2 mm. The type, thickness, and shape of the substrates is not intended to be limiting.

Each of the robotic arms 111A, 111B are capable of retrieving substrates from the cassettes. The robotic arms operate simultaneously with respect to one another, or sequentially with respect to one another. Each of the modules are controlled using a transfer controller 101. In some embodiments, which can be combined with other embodiments described herein, the first transfer system 110 retrieves substrates from one or more of the pod assemblies 104 and aligns each of the substrates using the alignment apparatus 108. The alignment apparatus 108 is capable of reading alignment features on each of the substrates and aligns each of the substrates prior to transferring the substrates to the buffer module 120. The alignment features are geometric marks, such as notches, are readable by a camera and/or a sensor, such as a light sensor disposed on the alignment apparatus 108. The alignment apparatus is capable of positioning each substrate to a predetermined orientation, such as by rotation and translation in all directions. In some embodiments, which can be combined with other embodiments described herein, the alignment apparatus 108 is preprogrammed to align a variety of substrates having different types of alignment features, in accordance with predetermined configurations provided for each substrate. In conventional substrate handling processes, substrates are handled one at a time and with the same types of alignment features, thus an alignment apparatus is programmed with one alignment program at a time. The alignment apparatus 108 provided herein is capable of reading different types of alignment features on different types of substrates before transferring the substrates to the buffer module 120.

The buffer module 120 includes a buffer chamber 122 and a second transfer system 125. The alignment apparatus 108 is able to reposition the substrate 106 in an orientation to be positioned on a multi-substrate carrier 124 of the buffer module 120. The substrates are positioned and oriented on the carrier 124 in a predetermined configuration. The predetermined configuration is determined based on the processing parameters used during processing, such as patterning. The substrates 106 are flattened on the carrier 124 using any method known in the industry, such as clamping by vacuum, mechanical gripper, a combination thereof, or other methods known in the industry. The clamping is capable of flattening a variety of substrates 106 in preparation for processing in the process chamber 132. The clamping in the buffer chamber 122 is capable of flattening substrates having deformations of up to 20 mm (e.g., as measured from peak to valley of the deformation). Substrate deformations are convex or concave in shape extending from the substrate center to a radial, outer edge of the substrate, or from one edge to a second edge of the substrate. In some embodiments, which can be combined with other embodiments described herein, edge to edge deformations are in the form of several waves at various intervals. The adaptive adjustment capability of the buffer module 120 enables preparation of substrates, which are subject to different fabrication history, for further processing, such as patterning. The buffer chamber 122 is capable of setting and maintaining environmental parameters, such as temperature, pressure, humidity, and combinations thereof. In some aspects, the buffer chamber 122 is capable of degassing the substrates or removing any particles, chemicals, radiation, and other potential environmental impurities on the substrates. Although only a single carrier is depicted in FIG. 1, it is also contemplated that several carriers 124 can be loaded, unloaded, and conditioned simultaneously. Operations of the buffer chamber 122 are also simultaneous with transferring of substrates, and other operations provided herein. Each carrier is capable of holding, for example, 1 to 8 substrates. Each carrier holds substrates of the same type, and/or each carrier holds substrates of different types. The carrier of substrates are held in the buffer chamber 122 until the process module 130 is available to receive the carrier of substrates. The set of substrates disposed on each carrier is referred to herein as a "batch." The batch is loaded into a process chamber 132 of the processing module 130 and is process therein. The batch is loaded using a second transfer system 125. The second transfer system 125 is capable of transferring a carrier of substrates between the process chamber 132 and the buffer chamber 122. In some embodiments, which can be combined with other embodiments described herein, the second transfer system 125 includes one more robots, such as robotic arms 123A, 123B. The robotic arms 123A, 123B are capable of transferring carriers unloading/loading the process chamber 132 and the buffer chamber 122 simultaneously, such as by swapping a processed batch of substrates, with an unprocessed batch of substrates. Swapping batches between the process chamber 132 and the buffer chamber 122 simultaneously does not impact throughput, such as conventional handling systems that are not able to swap batches simultaneously.

A dispatch time (e.g., pod-to-buffer time) for transferring a batch of substrates from one or more of the pod assemblies to the alignment apparatus 108, to the buffer chamber 122, followed by conditioning time in the buffer chamber 122, and transfer to the process module 130, is about 5 seconds to about 20 seconds per substrate on the carrier according to one embodiment, such as about 20 seconds to about 60 seconds for a batch size of four, such as about 30 seconds to about 50 seconds, alternatively about 30 seconds to about 120 seconds for a batch size of six, such as about 50 seconds to about 70 seconds, alternatively about 40 seconds to about 120 seconds for a batch size of eight, such as about 60 seconds to about 80 seconds. In some embodiments, which can be combined with other embodiments described herein, the dispatch time is only added to total throughput once, at the beginning of the process. In particular, the dispatch operations of a batch are simultaneous with processing operations of other batches of substrates and do not impact throughput after the first batch is loaded to the process chamber 132.

A process time in the process chamber 132 is about 60 seconds to about 200 seconds according to one embodiment, such as about 100 seconds to about 140 seconds, such as about 120 seconds. After processing, the processed substrates are returned to the buffer chamber 122 using second transfer system 125. Each substrate is decoupled from the carrier 124, and transferred back to one or more pod assemblies 104. In particular, each substrate is returned to the pod assembly from which it was unloaded from at the beginning of the process. The return time (e.g., post-process-to-pod time) from the process chamber 132 back to the pod assemblies 104 is about 2 seconds to about 15 seconds per substrate of the batch according to one embodiment, such as about 8 seconds to about 60 seconds for a batch size of four, such as about 20 seconds to about 40 seconds, alternatively about 12 seconds to about 70 seconds for a batch size of six, such as about 30 seconds to about 50 seconds, alternatively about 16 seconds to about 100 seconds for a batch size of eight, such as about 40 seconds to about 50 seconds. In some embodiments, which can be combined with other embodiments described herein, the dispatch time is only added to total throughput once, at the end of the entire process. In particular, the return operations of a batch are simultaneous with processing operations of other batches of substrates and do not impact throughput until the last batch to be processed. The throughput for processing batches of 4 substrates is about 80 substrates per hour to about 130 substrates per hour according to one embodiment, or for batches of 6 substrates is about 100 substrates per hour to about 170 substrates per hour, or for batches of 8 substrates is about 120 substrates per hour to about 220 substrates per hour. In some embodiments, which can be combined with other embodiments described herein, for batch sizes of about 2 to about 8 substrates, the throughput is about 80 substrates per hour to about 220 substrates per hour. The throughput is further described with reference to the method depicted in FIG. 2.

Figure 2:
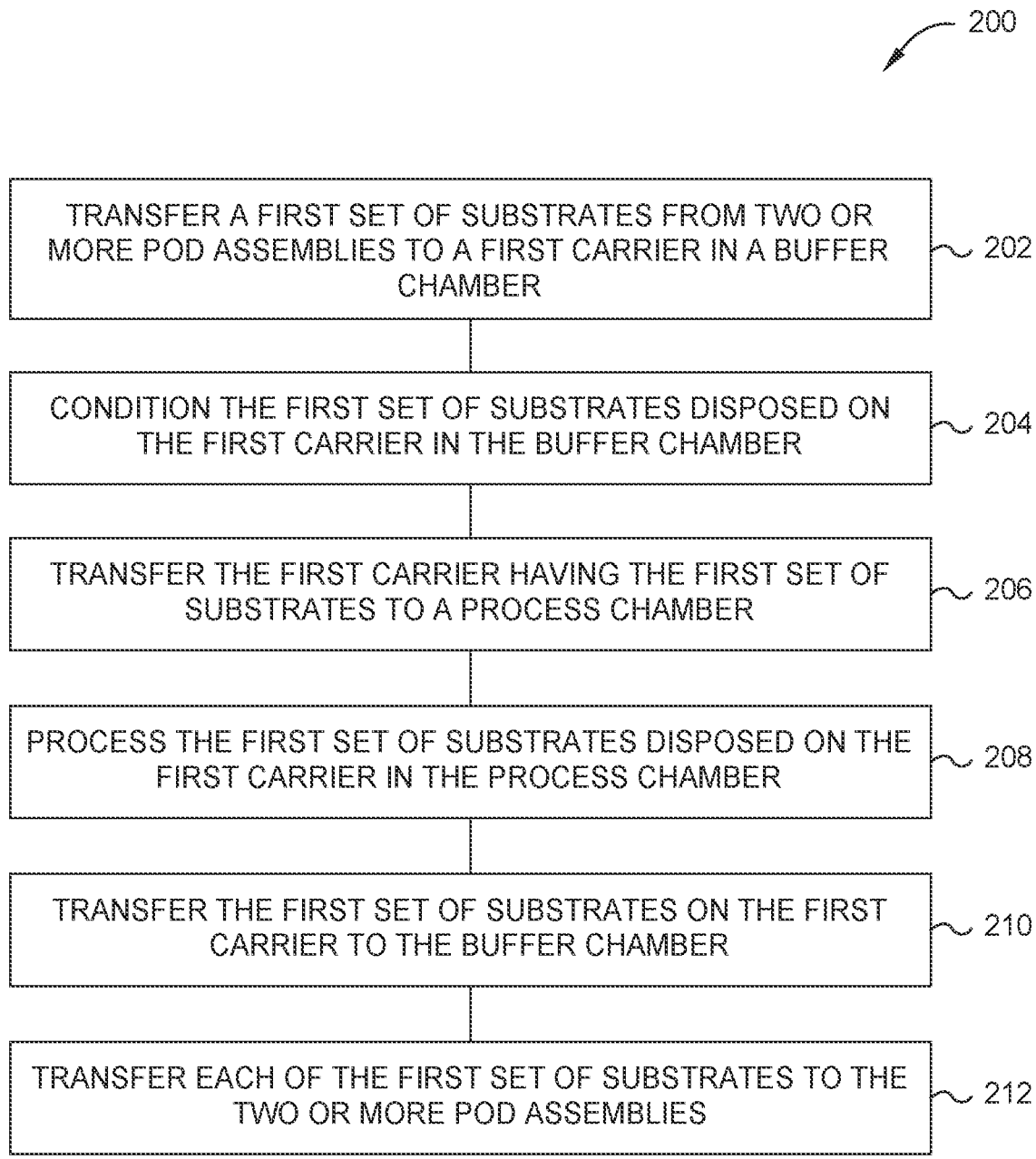
FIG. 2 depicts a method flow diagram in accordance with an embodiment of the present disclosure.
Figure 3:
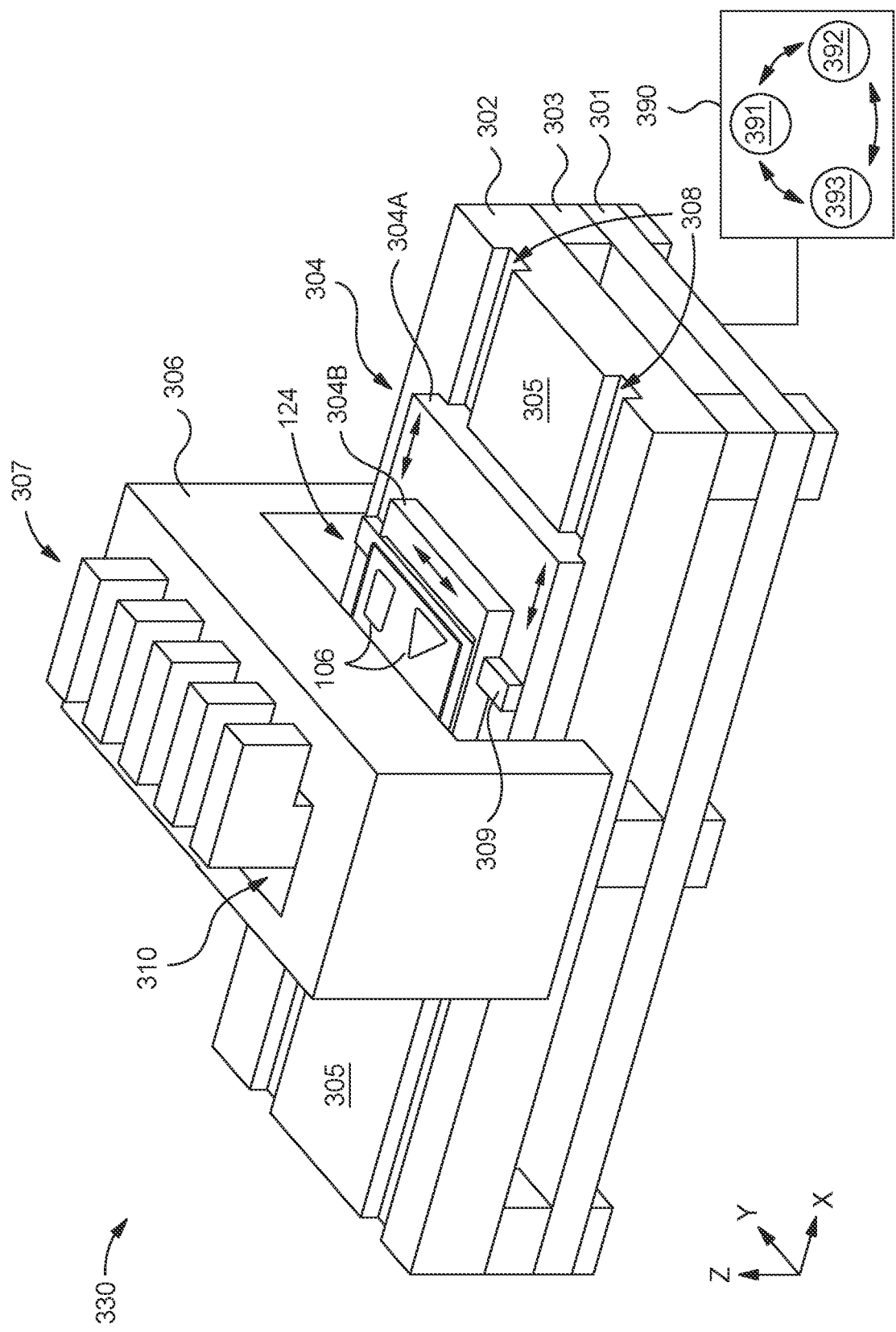
FIG. 3 depicts a lithography apparatus in accordance with an embodiment of the present disclosure.

FIG. 2 depicts a method 200 flow diagram using the system 100, in accordance with an embodiment of the present disclosure. In operation 202, a first set of substrates from two or more pod assemblies are transferred to a first carrier in a buffer chamber. Each of the substrates are aligned at an alignment apparatus prior to transferring to the first carrier. In operation 204, the first set of substrates disposed on the first carrier are conditioned in the buffer chamber. The conditioning time differs for each substrate as the substrates are loaded on the carrier. The conditioning parameters are determined based on a predetermined process to be used in a process chamber. In operation 206, the first carrier having the first set of substrates is transferred to the process chamber. The elapsed time from operation 202 to operation 206 is referred to herein as a "dispatch time." The dispatch time contributes to a total process time only for the first set of substrates. All other dispatch times for the second set of substrates to the last set of substrates are not calculated in the total process time with respect to total throughput because operations 202, 204, and 206 are completed simultaneously with processing the first set of substrates in the process chamber, as described in operation 208 of the method 200. In operation 210, the first set of substrates in the first carrier is transferred to the buffer chamber and in operation 212, each of the first set of substrates are returned to the two or more pod assemblies. The elapsed time from operations 210 to 212 is referred herein as a "return time." The return time for the first set of substrates does not contribute to a total process time because the return time is completed simultaneously with the dispatch of a second set of substrates and/or the processing operation of 208. In particular, the return time is only added to the total process for the last set of substrates processed. In some embodiments, which can be combined with other embodiments described herein, the processing module 130 is a lithography apparatus 330 as depicted in FIG. 3.

The lithography apparatus 330 is configured to simultaneously process a set of substrates disposed on the carrier. In some embodiments, which can be combined with other embodiments described herein, each of the substrates have different characteristics and/or lithography apparatus is configured to process each of the substrates using different processing parameters, such as using different pattern design files. The lithography apparatus 330 includes a frame 301, a base 302 disposed on the frame 301 with vibration isolators 303 interposed therebetween, a motion stage 304 disposed on a planar base surface 305, and a substrate carrier 124 disposed on the motion stage 304. The lithography apparatus 330 further includes a bridge 306 coupled to the base 305 and is separated therefrom by a height sufficient to allow the motion stage 304, and substrate carrier 124 with the set of substrates 106 disposed thereon, to pass therebetween.

The motion stage 304 is an X-Y linear translation motion stage having a first platform 304a disposed on the base surface 305 and movable relative thereto in an X-direction (e.g., on tracks 308) and a second platform 304b disposed on the first platform 304a and movable relative thereto in a Y-direction (e.g., tracks 309).

The bridge 306 supports a plurality of optical modules 307 which are disposed through an opening 310 therein. The plurality of optical modules 307 are positioned to face the base surface 305, and thus the set of substrates 106 disposed on the carrier 124 as the motion stage 304 travels between the bridge 306 and the base surface 305. An image sensor is used to detect one or more alignment features formed in or patterned on each substrate. The system controller 390 determines the pattern offset information and uses the information to pattern the substrate using a corresponding design file for the substrate. Each substrate corresponds to one or more design files. Each design file is used by one or more lithography exposure sources which direct and/or focuses electromagnetic radiation, e.g., one or more UV laser beams, to, on, or beneath a surface of the a resist layer deposited on the substrate to form a pattern thereon. The system controller 390 includes a programmable central processing unit (CPU)

391 that is operable with a memory 392 (e.g., non-volatile memory) and support circuits 393. The support circuits are conventionally coupled to the CPU 391 and include cache, clock circuits, input/output subsystems, power supplies, and the like, and combinations thereof coupled to the various components of the lithography apparatus 330. The CPU 391 is one of any form of general purpose computer processor used in an industrial setting, such as a programmable logic controller (PLC), for controlling various components and sub-processors of the lithography apparatus 330. The memory 392, coupled to the CPU 391, is non-transitory and is typically one or more of readily available memories such as random access memory (RAM), read only memory (ROM), or any other form of digital storage, local, or remote. Typically, the memory 392 is in the form of a computer-readable storage media containing instructions, that when executed by the CPU 391, facilitates the operation of the lithography apparatus 330.

The controller 390 is communicatively coupled to the transfer controller 101 described with reference to FIG. 1. In operation, the transfer controller 101 is capable of transferring in carriers having unprocessed substrates into the lithography apparatus 330 and transferring out carriers having processed substrates based on signals from the controller 390. The integrated control scheme of the lithography apparatus and the transfer controller 101 enables simultaneous processing of substrates and transferring additional sets of substrates to be processed.

Example

Table 1 provides an illustrative example of the throughput benefits provided by the methods and systems of the present disclosure. The process times are provided using batch sizes of four substrates per carrier, six substrates, and eight substrates. Although the system and methods allow for substrates to be retrieved from different FOUPs, for ease of comparison, the example provides for total process times of process all substrates from a single FOUP holding 24 substrates. For batches sizes of four substrates per carrier, six total batches are processed. The total process time all six batches includes: a dispatch time for the first batch (e.g., 50 seconds), process time of 120 seconds per batch times the number of batches (e.g., 120×6 seconds), and return time for the last batch (e.g., 30 seconds). The total round trip time for an entire FOUP of substrates having six batches was 800 seconds with a throughput of 108 substrates per hour. Similarly, the total round trip time for four batches with 6 substrates per batch was 580 seconds with a throughput of 148 substrates per hour, and the total round trip time for three batches with 8 substrates per batch was 480 seconds with a throughput of 480 substrates per hour. As can be seen, the processes, and systems provided herein demonstrate an improvement over conventional processes with an ability to process multiple substrates at a time, and to economize dispatch and return times by simultaneous operation with processing.

TABLE 1

| Throughput example for batch sizes of 4, 6, and 8. | | | |
|---|---|---|---|
| Substrates per batch | 4 | 6 | 8 |
| Total Batches Per Pod (24 substrates per pod) | 6 | 4 | 3 |
| (1) Dispatch Time First Set [sec] | 50 | 60 | 70 |
| (2) Lithography Process Time of Each Batch [sec] | 120 | 120 | 120 |
| (3) Return Time Last Batch [sec] | 30 | 40 | 50 |
| Total Round Trip Time Per FOUP [sec] | 50 + 120 × 6 + 30 = 800 | 60 + 120 × 4 + 40 = 580 | 70 + 120 × 3 + 50 = 480 |
| Substrates Per Hour | 24*3600/800 = 108 | 24*3600/580 = 148 | 24*3600/480 = 180 |

In summation, a multi-substrate handling system is provided having an alignment apparatus capable of positioning each of a set of substrates in predetermined orientations for transfer. A buffer chamber is configured to receive and condition the set of substrates which are disposed on a substrate carrier. A first transfer assembly is configured to transfer the set of substrates to and from the buffer chamber and is capable of transferring each of the set of substrates from the alignment apparatus to the carrier in the buffer chamber. The carrier includes a plurality of modules capable of securing the set of substrates. The system includes a second transfer assembly having at least two robots configured to transfer the carrier of the set of substrates between the buffer chamber and a process chamber. The process chamber is capable of processing the set of substrates using different process parameters for each substrate.

What is claimed is:

1. A system, comprising:
   an alignment apparatus, the alignment apparatus is capable of positioning each of a set of substrates in predetermined orientations for transfer;
   a buffer chamber configured to receive and condition the set of substrates;
   a first transfer assembly configured to transfer the set of substrates to and from the buffer chamber, the first transfer assembly is capable of transferring each of the set of substrates from the alignment apparatus to a carrier in the buffer chamber, the carrier comprises a plurality of modules capable of securing the set of substrates; and
   a second transfer assembly comprising at least two robots configured to transfer the carrier of the set of substrates between the buffer chamber and a process chamber, the process chamber is capable of processing the set of substrates using different process parameters for each substrate.

2. The system of claim 1, wherein the process chamber is configured to process each of the set of substrates on the carrier simultaneously.

3. The system of claim 1, wherein the process chamber is a lithography system configured to process at least two of the set of substrates simultaneously using different design files.

4. The system of claim 1, wherein the first transfer assembly and the second transfer assembly are capable of operating simultaneously with one another.

5. The system of claim 1, wherein the buffer chamber comprises multiple carriers, wherein the buffer chamber and the process chamber are capable of operating simultaneously with one another.

6. The system of claim 1, further comprising an interface module comprising two or more pod assemblies, wherein the first transfer assembly is configured to transfer the set of substrates between the two or more pod assemblies and the buffer chamber.

7. The system of claim 1, wherein each set of substrates includes substrates having different substrate characteristics comprising geometry, size, composition, transparency, or combinations thereof.

8. The system of claim 1, wherein the first transfer assembly comprises a first and second robot, each robot capable of operating simultaneously with one another.

9. The system of claim 8, wherein the second transfer assembly comprises a third and fourth robot, each of the third and fourth robot capable of operating simultaneously with one another.

10. A method, comprising:
 transferring a first set of substrates from two or more pod assemblies to a first carrier in a buffer chamber, wherein the first set of substrates comprises at least two substrates with different substrate characteristics relative to one another;
 conditioning the first set of substrates disposed on the first carrier in the buffer chamber;
 transferring the first carrier having first set of substrates to a process chamber; and
 processing the first set of substrates disposed on the first carrier in the process chamber, wherein processing the first set of substrates uses different process parameters for each substrate.

11. The method of claim 10, further comprising aligning each substrate transferred from the two or more pod assemblies at an alignment apparatus prior to transferring to the buffer chamber.

12. The method of claim 10, further comprising transferring a second set of substrates from two or more pod assemblies to a second carrier in the buffer chamber, wherein transferring the second set of substrates occurs simultaneously with processing the first set of substrates in the process chamber.

13. The method of claim 12, further comprising conditioning the second set of substrates disposed on the second carrier in the buffer chamber, wherein conditioning the second set of substrates occurs simultaneously with processing the first set of substrates in the process chamber.

14. The method of claim 13, wherein a total round trip time of the first set of substrates and the second set of substrates processed simultaneously is about 15% to about 30% less than a cumulative round trip time of processing the first set of substrates and the second set of substrates sequentially, wherein round trip refers to transferring substrates from the two or more pod assemblies, to the buffer chamber, to the processing chamber, to the buffer chamber, and back to the two or more pod assemblies.

15. The method of claim 10, further comprising:
 transferring the first set of substrates from the process chamber to the buffer chamber after processing the first set of substrates;
 removing each substrate from the first carrier in the buffer chamber; and
 transferring the first set of substrates from the buffer chamber to each respective pod assembly of the two or more pod assemblies.

16. The method of claim 10, wherein transferring the first set of substrates from two or more pod assemblies to the first carrier in the buffer chamber further comprises transferring the first set of substrates using a first and second robot, wherein each robot transfers substrates simultaneous with one another.

17. The method of claim 10, wherein a total round trip time of processing six sets of four substrates is about 600 seconds to about 1000 seconds.

18. The method of claim 10, wherein transferring the first set of substrates comprises a transfer time of about 1 second to about 10 seconds per substrate.

19. A substrate handling system, comprising:
 a first transfer assembly configured to transfer a set of substrates to and from a buffer chamber, wherein the buffer chamber is configured to condition the set of substrates, wherein the buffer chamber comprises a carrier configured to secure the set of substrates for processing; and
 a second transfer assembly configured to transfer the carrier of the set of substrates between the buffer chamber and a lithography apparatus, wherein the lithography apparatus is capable of processing each substrate of the set of substrates simultaneously with one another.

20. The substrate handling system of claim 19, wherein the set of substrates comprises 2 to 8 substrates.

* * * * *